United States Patent
Kim et al.

(10) Patent No.: US 11,869,999 B2
(45) Date of Patent: Jan. 9, 2024

(54) ELECTRONIC DEVICE COMPRISING SOLAR CELLS OF MULTIPLE TYPES

(71) Applicant: SAMSUNG ELECTRONICS CO., LTD., Suwon-si (KR)

(72) Inventors: Daehyun Kim, Suwon-si (KR); Youngjun Park, Suwon-si (KR); Jeongman Lee, Suwon-si (KR); Kyungwoo Lee, Suwon-si (KR); Chongmin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 59 days.

(21) Appl. No.: 17/262,484

(22) PCT Filed: Jul. 19, 2019

(86) PCT No.: PCT/KR2019/008940
§ 371 (c)(1),
(2) Date: Jan. 22, 2021

(87) PCT Pub. No.: WO2020/022705
PCT Pub. Date: Jan. 30, 2020

(65) Prior Publication Data
US 2021/0288201 A1    Sep. 16, 2021

(30) Foreign Application Priority Data
Jul. 23, 2018 (KR) .......... 10-2018-0085475

(51) Int. Cl.
*H01L 31/055* (2014.01)
*H01L 31/054* (2014.01)
(Continued)

(52) U.S. Cl.
CPC ........ *H01L 31/055* (2013.01); *H01L 31/0543* (2014.12); *H01L 31/0547* (2014.12);
(Continued)

(58) Field of Classification Search
CPC .. H01L 31/055; H01L 31/076; H01L 31/0725
See application file for complete search history.

(56) References Cited

U.S. PATENT DOCUMENTS

| | | | |
|---|---|---|---|
| 2008/0223438 A1* | 9/2008 | Xiang ............... | H01L 31/055 136/257 |
| 2009/0120488 A1 | 5/2009 | Gorog et al. | |

(Continued)

FOREIGN PATENT DOCUMENTS

| | | |
|---|---|---|
| EP | 2 548 232 | 1/2013 |
| JP | 2016-122755 | 7/2016 |

(Continued)

OTHER PUBLICATIONS

Extended Search Report dated Jun. 14, 2021 in counterpart European Patent Application No. 19841160.5.
(Continued)

*Primary Examiner* — Ryan S Cannon
(74) *Attorney, Agent, or Firm* — Nixon & Vanderhye, P.C.

(57) ABSTRACT

According to various embodiments, an electronic device comprises: a polymer including a plurality of quantum dots; at least one first solar cell disposed on a lower portion of the polymer; and at least one second solar cell disposed on a side portion of the polymer; and a battery configured to be charged with electrical energy from at least one of the first solar battery or the second solar battery, wherein: the first solar battery, in a first wavelength band, has a conversion efficiency greater than or equal to a threshold value; the second solar battery, in a second wavelength band different from the first wavelength band, has a conversion efficiency greater than or equal to the threshold value; and the wavelength of light that passes through the polymer may be within the first wavelength band, and the wavelength of light that is absorbed by at least some of the plurality of quantum (Continued)

dots and then remitted may be within the second wavelength bandwidth. Other various embodiments are possible.

9 Claims, 13 Drawing Sheets

(51) Int. Cl.
*H02S 10/20* (2014.01)
*H02S 40/30* (2014.01)

(52) U.S. Cl.
CPC .......... *H01L 31/0549* (2014.12); *H02S 10/20* (2014.12); *H02S 40/30* (2014.12)

(56) References Cited

U.S. PATENT DOCUMENTS

| | | | |
|---|---|---|---|
| 2009/0229652 A1* | 9/2009 | Mapel | H01L 31/055 136/246 |
| 2010/0193011 A1* | 8/2010 | Mapel | C03C 3/21 136/246 |
| 2010/0243053 A1 | 9/2010 | Coe-Sullivan et al. | |
| 2010/0275999 A1* | 11/2010 | Buelow, II | H01L 31/0547 136/259 |
| 2011/0114174 A1 | 5/2011 | Rennig et al. | |
| 2011/0192446 A1* | 8/2011 | Kawai | H01L 31/055 136/247 |
| 2013/0118554 A1* | 5/2013 | Niwa | F24S 23/80 136/246 |
| 2014/0000704 A1 | 1/2014 | Farahi | |
| 2015/0115898 A1 | 4/2015 | Yung et al. | |
| 2015/0162547 A1* | 6/2015 | Umeda | H01L 31/0547 136/259 |
| 2016/0204297 A1* | 7/2016 | Vasiliev | H02S 30/10 136/246 |
| 2019/0273171 A1* | 9/2019 | Bergström | H01L 31/0549 |

FOREIGN PATENT DOCUMENTS

| | | | | |
|---|---|---|---|---|
| KR | 10-2004-0056679 | | 7/2004 | |
| KR | 10-1101417 | | 1/2012 | |
| KR | 10-2016-0077183 | | 7/2016 | |
| KR | 10-1806548 | | 12/2017 | |
| WO | 2009/024509 | | 2/2009 | |
| WO | 2011/114262 | | 9/2011 | |
| WO | WO-2012050059 A1 * | 4/2012 | ......... H01L 31/0547 |
| WO | 2014/038568 | | 3/2014 | |
| WO | 2017/207544 | | 12/2017 | |

OTHER PUBLICATIONS

International Search Report for PCT/KR2019/008940 dated Oct. 24, 2019, 2 pages.
Written Opinion of the ISA for PCT/KR2019/008940 dated Oct. 24, 2019, 5 pages.
Office Action dated May 26, 2023 in corresponding Korean Patent Application No. 10-2016-0085475 and English-language translation.
Communication pursuant to Article 94(3) EPC dated Jan. 11, 2023 in European Patent Application No. 19841160.5.

* cited by examiner

ELECTRONIC DEVICE COMPRISING SOLAR CELLS OF MULTIPLE TYPES

CROSS-REFERENCE TO RELATED APPLICATION(S)

This application is a National Phase Entry of PCT international Application No. PCT/KR2019/008940, which was filed on Jul. 19, 2019, and claims priority to Korean Patent Application No. 10-2018-0085475 filed on Jul. 23, 2018, in the Korean Intellectual Property Office, the contents of which are incorporated herein by reference.

BACKGROUND

1. Field

Various embodiments relate to an electronic device including solar cells of multiple types, and more particularly, to an electronic device including solar cells of multiple types having different wavelength bands with relatively high efficiency.

2. Description of the Related Art

A mobile electronic device or a wearable electronic device can execute various application programs and can provide various functions for the convenience for users. A mobile electronic device or a wearable electronic device may include various units of hardware for providing various functions. When various units of hardware are driven or applications requiring a large amount of calculation are executed, the magnitude of power that a mobile electronic device or a wearable electronic device consumes may rapidly increase.

Since mobile electronic devices or wearable electronic devices are manufactured in small sizes for the convenience of carrying or wearing, they include a battery having relatively small capacity. As described above, when the magnitude of power consumption rapidly increases, the built-in battery may be quickly discharged, so electronic device including a solar cell for constant charging have been proposed.

SUMMARY

In general, electronic devices include a solar cell disposed in an area to which light is mainly incident. For example, when an electronic device is positioned in a specific direction, a solar cell may be disposed at a portion to which a relatively large amount of light is incident. The specific direction may be a direction in which the electronic device is frequently positioned. However, it cannot be secured that an electronic device is always positioned in a specific direction. Further, even if an electronic device is positioned in a specific direction, the light that is not incident to a disposed solar cell may be excluded from photoelectric conversion.

Various embodiments have been made in an effort to solve the problems described above or other problems and an electronic device that includes at least one quantum dot being able the change the path of light, and includes a plurality of types of solar cells that can perform photoelectric conversion on light discharged by the quantum dot and incident light with relatively high efficiency regardless of the quantum dot may be provided.

According to various embodiments, an electronic device includes: a polymer including a plurality of quantum dots; at least one first solar cell disposed under the polymer; at least one second solar cell disposed on a side of the polymer; and a battery configured to be charged with electrical energy from at least one of the first solar cell or the second solar cell, in which the first solar cell may have conversion efficiency equal to or higher than a threshold value in a first wavelength band, the second solar cell may have conversion efficiency equal to or higher than the threshold value in a second wavelength band different from the first wavelength band, a wavelength of a first portion of first light passing through the polymer may be included in the first wavelength band, and a wavelength of a first portion of second light absorbed and then discharged again by at least some of the plurality of quantum dots may be included in the second wavelength band.

According to various embodiments, an electronic device includes: a polymer including a plurality of quantum dots; at least one first solar cell configured to receive first light passing through the polymer and convert the light into first electrical energy with first conversion efficiency that is equal to or higher than a threshold value; at least one second solar cell configured to receive second light absorbed and the discharged by at least some of the plurality of quantum dots, and convert the second light into second electrical energy with conversion efficiency that is equal to or higher than the threshold value; and a battery configured to be charged with at least a portion of the first electrical energy or the second electrical energy.

According to an embodiment, an electronic device includes: a polymer including a plurality of quantum dots; at least one solar cell disposed on a side of the polymer; a reflection layer disposed under the polymer; and at least one prism or at least one lens disposed in the polymer, in which the at least one prism or the at least one lens may change a traveling direction of light absorbed and then discharged again by at least some of the plurality of quantum dots to the solar cell, and the solar cell may convert the light absorbed and then discharged by the at least some of the plurality of quantum dots with conversion efficiency that is equal to or higher than a threshold value.

According to various embodiments, a watch-type electronic device includes: a housing; a display exposed at least partially through an opening formed in the housing; a polymer connected to the housing and having a shape that can be worn on a wrist of a user-the polymer includes a plurality of quantum dots; at least one first solar cell disposed under the polymer; at least one second solar cell disposed on a side of the polymer; and a battery configured to be charged with electrical energy from at least one of the first solar cell or the second solar cell, in which the first solar cell may have conversion efficiency equal to or higher than a threshold value in a first wavelength band, the second solar cell may have conversion efficiency equal to or higher than the threshold value in a second wavelength band different from the first wavelength band, a wavelength of first light passing through the polymer may be included in the first wavelength band, and a wavelength of second light absorbed and then discharged again by at least some of the plurality of quantum dots may be included in the second wavelength band.

According to various embodiments, an electronic device that includes at least one quantum dot being able the change the path of light, and includes a plurality of types of solar cells that can perform photoelectric conversion on light discharged by the quantum dot and incident light with relatively high efficiency regardless of the quantum dot may be provided.

DETAILED DESCRIPTION

Figure 1A:
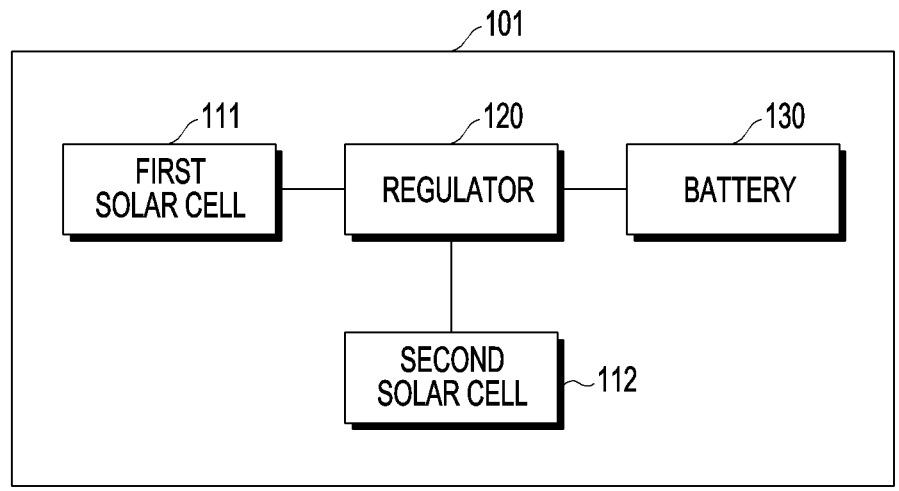
FIG. 1A is a block diagram of an electronic device according to various embodiments.

An electronic device according to various embodiments may be one of various types of electronic devices. It should be appreciated that various embodiments of the disclosure and the terms used therein are not intended to limit the technological features set forth herein to particular embodiments and include various changes, equivalents, and/or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via another element (e.g., third element).

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

FIG. 1A is a block diagram of an electronic device according to various embodiments.

As shown in FIG. 1A, an electronic device 101 according to various embodiments may include a first solar cell 111, a second solar cell 112, a regulator 120, and a battery 130.

The first solar cell 111 can convert incident light into electrical energy. For example, the first solar cell 111 may include a diode composed of a p-type semiconductor and an n-type semiconductor. When a photon comes inside from the outside, an electron and a hole are formed, whereby electrical energy can be generated. For example, the first solar cell 111 may be a silicon-type solar cell. The first solar cell 111, as a wafer-based solar cell, may be a mono crystalline solar cell or a multi crystalline solar cell. For example, the first solar cell 111, as a thin film solar cell, may be an amorphous solar cell. For example, the first solar cell 111 may be a compound semiconductor solar cell. The first solar cell 111 may be a solar cell including II-III-VI-group semiconductors (e.g., a Cupper-Indium-Selenide (CIS) solar cell or a Cupper-Indium-Gallium-Selenide (CIGS) solar cell). The first solar cell 111 may be a solar cell including II-VI-group semiconductors (e.g., a CdTe solar cell, a CdS solar cell, and Cu2S solar cell). The first solar cell 111 may be a solar cell including III-V-group semiconductors (e.g., a GaAs solar cell and an InP solar cell). The first solar cell 111 may be various types of solar cell such as a dye-sensitized type solar cell or a polymer type solar cell, and the type of the solar cell is not limited.

According to various embodiments, the first solar cell 111 may be disposed in a first part of the electronic device 101. For example, the first part may be a part to which a relatively large amount of light is incident when the electronic device 101 is positioned in a specific direction, and the position of the first part is not limited.

According to various embodiments, the second solar cell 112 may be a solar cell of at least one of the various types of the first solar cell 111 described above. The type of the second solar cell 112 may be different from the type of the first solar cell 111. For example, the first solar cell 111 may be a dye-sensitized solar cell and the second solar call 112 may be a GaAs solar cell. For example, the first solar cell 111 may be a solar cell having photoelectric conversion efficiency that is equal to or higher than a threshold value designated for a first wavelength band of light and the second solar cell 112 may be a solar cell having photoelectric conversion efficiency that is equal to or higher than a threshold value designated for a second wavelength band of light. The first wavelength band and the second wavelength band may be different. For example, the first wavelength band and the second wavelength band may have no wavelengths overlapping each other, or the first wavelength band and the second wavelength band may overlap each other in a partial band.

Accordance to various embodiments, the wavelength of visible light that is incident to the electronic device 101 may be included in the first wavelength band corresponding to the first solar cell 111. The wavelength of light emitted from quantum dots included in the electronic device 101 may be included in the second wavelength band corresponding to the second solar cell 112. The visible light that is incident to the electronic device 101 may be absorbed into quantum dots and then discharged again. The wavelength of the re-discharged light may be larger than the wavelength of the light before the light is incident to the quantum dots. The second solar cell 112 may be a solar cell having relatively high efficiency at the wavelength of the light discharged again from the quantum dots. Accordingly, the type of the second solar cell 112 may be selected, based on at least one of the kind or the size of the quantum dots. When electric potential is generated around a quantum dot, an electromagnetic level changes and a light absorption wavelength shift is generated, whereby light absorption efficiency may increase. For example, when a light absorption wavelength shifts from 520 nm to 526 nm, the light absorption efficiency may increase by 15%. Accordingly, the number of photons that are transmitted to a solar cell disposed on a side of the LSC may increase. In more detail, when the energy level of a quantum dot is changed, depending on electric potential applied to the outside of the quantum dot, a photoluminescence emission spectrum is changed, whereby an energy band may expand.

According to various embodiments, the second solar cell 112 may be disposed in a second part different from the first part of the electronic device 101. For example, the second part may be a position to which light emitted from quantum dots is mainly incident. The position of the first part and the position of the second part may be selected, based on at least one of the distribution of quantum dots or the positions of quantum dots.

According to the above description, the first solar cell 111 can perform photoelectric conversion using light traveling into and through the electronic device 101 regardless of the quantum dots. Further, the second solar cell 112 can perform photoelectric conversion using light that is absorbed into the quantum dots in the electronic device 101 and is then discharged again. Accordingly, since the second solar cell 112 can perform photoelectric conversion with relatively high efficiency at the wavelength of the light that is discharged from the quantum dots, the entire photoelectric conversion efficiency can be increased.

The regulator 120 can change the voltage of input power to a designated voltage and then output the power. The regulator 120 can change a voltage, based on various changing types such as a linear type or a switch type, but the changing type is not limited. The regulator 120 may be a DC/DC converter or a charger. For example, the regulator 120 can change a voltage to a voltage set for charging the battery 130. The regulator 120 may decrease the voltage of input power or may increase the voltage of input power.

The battery 130 can be charged with the power output from the regulator 120. The battery 130 can provide power for operating the regulator 120 or various units of hardware of the electronic device 101 which are not shown in the figures. Though not shown in the figures, the battery 130 may be connected to a Power Management Integrated Chip (PMIC) and the PMIC may change the voltage of the power output from the battery 130 to voltages for operating various units of hardware of the electronic device 101.

Figure 1B:
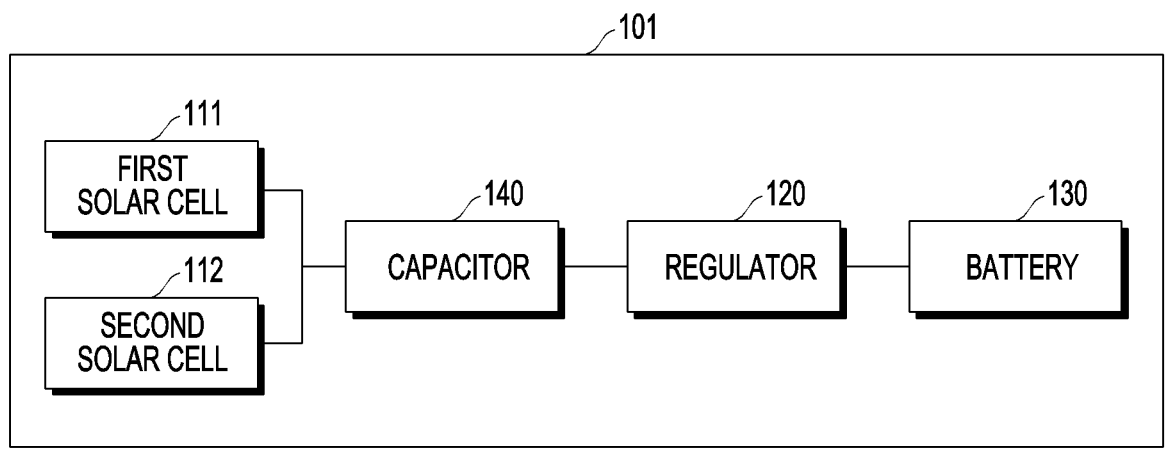
FIG. 1B is a block diagram of an electronic device according to various embodiments.

FIG. 1B is a block diagram of an electronic device according to various embodiments.

The electronic device 101 shown in FIG. 1B may further include a capacitor 140, as compared with FIG. 1A. The capacitor 140 can combine and store the electrical energy output from the first solar cell 111 and the electrical energy output from the second solar cell 112. The electrical energy combined by the capacitor 140 can be transmitted to the regulator 120.

Figure 1C:
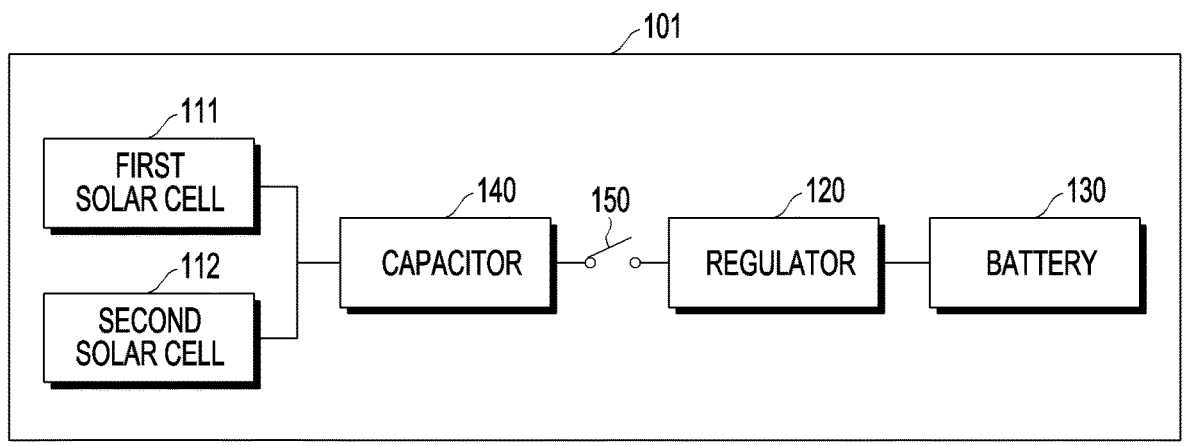
FIG. 1C is a block diagram of an electronic device according to various embodiments.

FIG. 1C is a block diagram of an electronic device according to various embodiments.

The electronic device 101 shown in FIG. 1C may further include a switch 150, as compared with FIG. 1B. The electronic device 101 can sense the magnitude of the voltage that is applied to the capacitor 140. The electronic device 101, for example, may include a sensor 140 that senses the voltage that is applied to the capacitor 140. The sensor 140 can measure, other than the voltage of the capacitor 140, the voltage, the current, the power, or the impedance at the output terminal of at least one of the first solar cell 111 or the second solar cell 112. The electronic device 101 can turn on the switch 150 such that charging is performed, when a sensed value satisfies predetermined conditions. For example, the electronic device 101 may include a control circuit that can check whether a sensed value satisfies the predetermined conditions (e.g., a processor, a Micro Computing Unit (MCU), a Field Programmable Gate Array (FGPA), or a logic circuit). The electronic device 101, for example, can control tuning-on/off of the switch 150, depending on whether the voltage of the capacitor 140 is equal to or larger than a predetermined threshold value, or not. The electronic device 101 can turn on the switch 150 when the voltage of the capacitor 140 is equal to or larger than the predetermined threshold value and can turn off the switch 150 when the voltage is lower than the predetermined threshold value. The threshold value is set in the unit of voltage, but this is just an example. That is, the threshold value may be set in the unit of a property (e.g., the unit of current, power, or impedance) that the sensor senses and may be set for a plurality of properties. In various embodiments, a calculation circuit that can turn on/off the switch 150 may be included in the sensor, and in this case, the sensor may be referred to as a sensor hub.

Figure 2A:
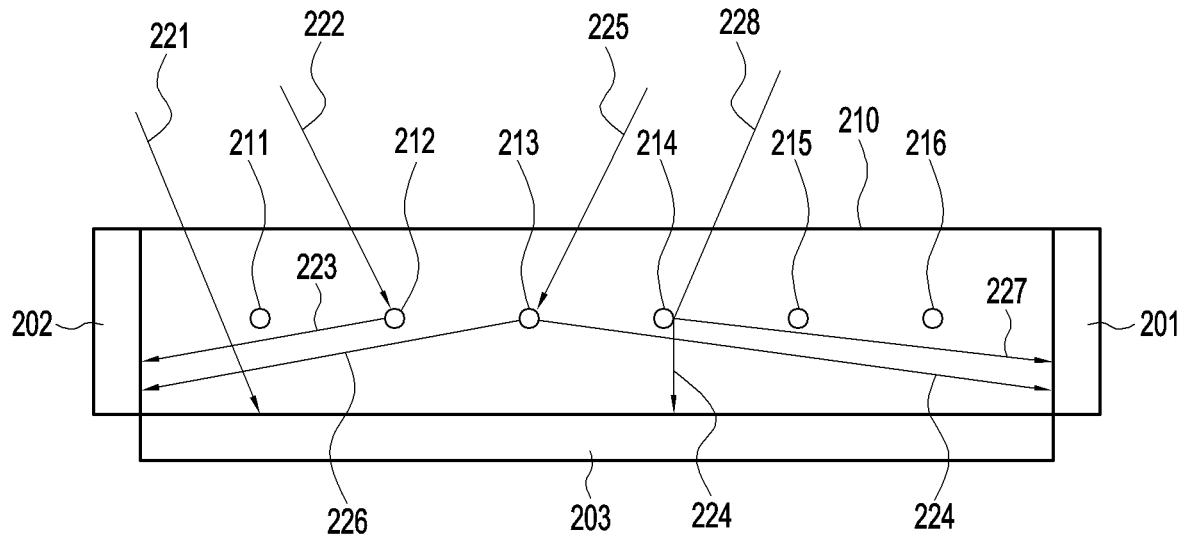
FIG. 2A is a cross-sectional view showing arrangement of a Luminescent Solar Concentrator (LSC) including quantum dots, and a solar cell according to various embodiments.
Figure 2B:
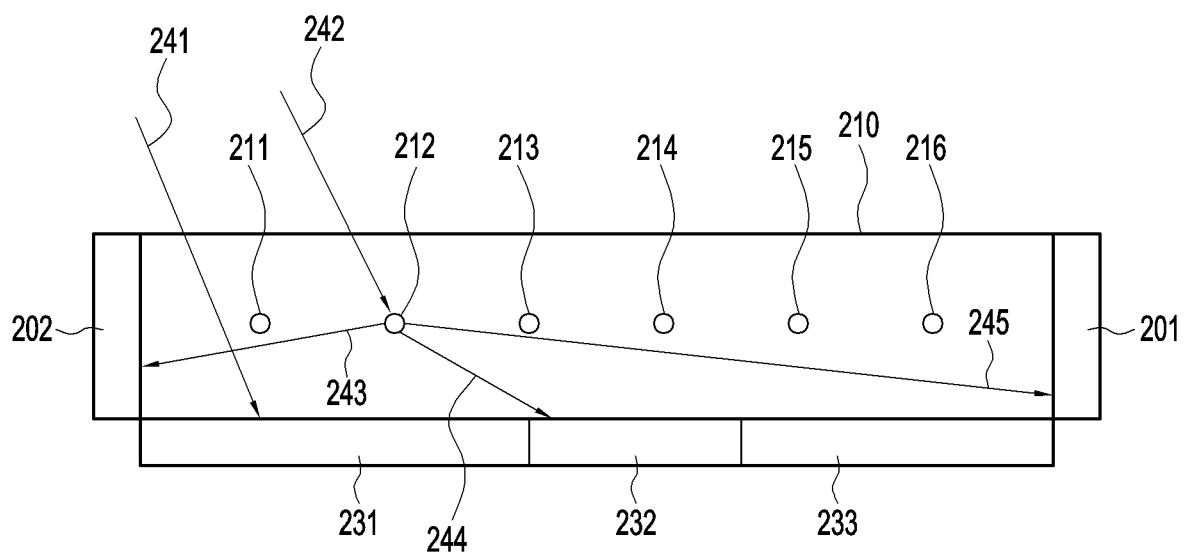
FIG. 2B is a cross-sectional view showing arrangement of a Luminescent Solar Concentrator (LSC) including quantum dots, and a solar cell according to various embodiments.
Figure 2C:
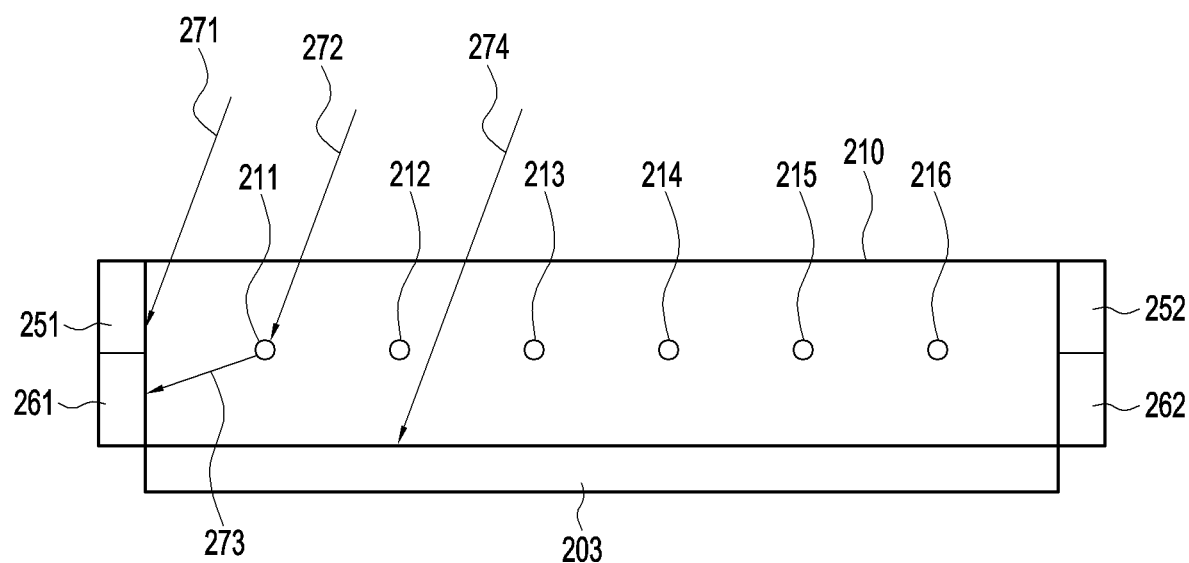
FIG. 2C is a cross-sectional view showing arrangement of a Luminescent Solar Concentrator (LSC) including quantum dots, and a solar cell according to various embodiments.

FIG. 2A is a cross-sectional view showing arrangement of a Luminescent Solar Concentrator (LSC) including quantum dots, and a solar cell according to various embodiments. FIG. 2B is a cross-sectional view showing arrangement of a Luminescent Solar Concentrator (LSC) including quantum dots, and a solar cell according to various embodiments. FIG. 2C is a cross-sectional view showing arrangement of a Luminescent Solar Concentrator (LSC) including quantum dots, and a solar cell according to various embodiments.

Referring to FIG. 2A, an electronic device 101 according to various embodiments may include an LSC 210 including at least one quantum dot 211, 212, 213, 214, 215, and 216. The LSC 210, for example, may be a polymer that is a ferroelectric, but there is no limitation as long as the substance can transmit light. The quantum dots 211, 212, 213, 214, 215, and 216, for example, are semiconductor particles having a diameter of 2 to 10 nm, and can absorb incident light beams 222, 225, and 228. The quantum dots 212, 213, and 214 can absorb the light beams 222, 225, and 228 and then can discharge again light beams 223, 224, 226, 227, and 229. The wavelengths of the light beams 223, 224, 226, 227, and 229 discharged again from the quantum dots 212, 213, and 214 may be larger than the wavelengths of the light beams 221, 222, 225, 228 that are incident to the electronic device 101. The wavelengths of the light beams 223, 224, 226, 227, and 229 discharged again from the quantum dots 212, 213, and 214 may be determined, for example, by at least one of the sizes or a property of the quantum dots 212, 213, and 214.

The first solar cell 203 may be disposed under the LSC 210. The second solar cells 201 and 202 may be disposed on sides of the LSC 210. The light beam 221 that is incident to the electronic device 101 and passes through the LSC 210 regardless of the quantum dots 211, 212, 213, 214, 215, and 216 can be incident to the first solar cell 203. The first solar cell 203 can convert an incident light beam 221 into electrical energy. The first solar cell 203 may be a solar cell having relatively high photoelectric conversion efficiency at the wavelength of the incident light beam 221. The second solar cells 201 and 202 can convert the light beams 223, 224, 226, 227, and 229 discharged again from the quantum dots 212, 213, and 214 into electrical energy. The second solar cells 201 and 202 may be solar cells having relatively high photoelectric conversion efficiency at the wavelengths of the light beams 223, 224, 226, 227, 229 discharged again from the quantum dots 212, 213, and 214.

Referring to FIG. 2B, the electronic device 101 according to various embodiments may include third solar cells 231 and 233 and a fourth solar cell 232. The third solar cells 231 and 233 and the fourth solar cell 232 may be disposed under the LSC 210. The light beam 241 that is incident to the electronic device 101 and passes through the LSC 210 regardless of the quantum dots 211, 212, 213, 214, 215, and 216 can be incident to the third solar cell 231. The third solar cells 231 and 233 can convert an incident light beam 241 into electrical energy. The third solar cells 231 and 233 may be solar cells having relatively high photoelectric conversion efficiency at the wavelength of the incident light beam 241. The fourth solar cell 232 can convert the light beam 244 discharged again from the quantum dot 212 into electrical energy. The fourth solar cell 232 may be a solar cell having relatively high photoelectric conversion efficiency at the wavelength of the light beam 244 discharged again from the quantum dot 212. Further, the second solar cells 201 and 202 can convert the light beams 243 and 245 discharged again from the quantum dot 212 into electrical energy. The second solar cells 201 and 202 may be solar cells having relatively high photoelectric conversion efficiency at the wavelength of the light beam 244 discharged again from the quantum dot 212. For example, the fourth solar cell 232 and the second solar cells 201 and 202 may be the same types. Since the light beams 243, 244, and 245 discharged again from the quantum dot 212 may be omnidirectionally discharged, a solar cell (e.g., the fourth solar cell 232) having relatively high photoelectric conversion efficiency at the wavelength of the light beams 244 discharged from the quantum dot 212 may be disposed under the LSC 210. The area ratio between the third solar cells 231 and 233 and the fourth solar cell 232 may be selected, for example, based on the ratio of the light beams passing through the bottom surface of the LSC 210 regardless of quantum dots and the light beams discharged again from the quantum dots, but there is no limitation. For example, the area ratio between the third solar cells 231 and 233 and the fourth solar cell 232 may be selected, based on the density of the quantum dots 211, 212, 213, 214, 215, and 216 in the LSC 210. Further, the position of the fourth solar cell 232 may be selected as a position to which light beams discharged again from the quantum dots usually travel, but is not limited thereto.

FIG. 2C shows a cross-section of an electronic device according to various embodiments.

Referring to FIG. 2C, the electronic device 101 may include a first solar cell 203, a fifth solar cell 251 and 252, and sixth solar cell 261 and 262. The first solar cell 203 may be disposed under the LSC 210. The fifth solar cells 251 and 252 and the sixth solar cells 261 and 262 may be disposed on sides of the LSC 210. A light beam 274 that is incident to the electronic device 101 and passes through the LSC 210 regardless of the quantum dots 211, 212, 213, 214, 215, and 216 can be incident to the first solar cell 203, and a light beam 271 passing through the LSC 210 regardless of the quantum dots 211, 212, 213, 214, and 216 can be incident to the fifth solar cell 251. The fifth solar cells 251 and 252 may be solar cells having relatively high photoelectric conversion efficiency at the wavelength of the incident light beam 271. For example, the fifth solar cells 251 and 252 may have the same type as the first solar cell 203. The sixth solar cells 261 and 262 can convert the light beam 273 discharged again from the quantum dot 211 into electrical energy. The sixth solar cells 261 and 262 may be solar cells having relatively high photoelectric conversion efficiency at the wavelength of the light beam 273 discharged again from the quantum dot 211. The area ratio between the fifth solar cells 251 and 252 and the sixth solar cells 261 and 262 may be selected, for example, based on the ratio of the light beams passing through the bottom surface of the LSC 210 regardless of quantum dots and the light beams discharged again from the quantum dots, but is not limited For example, the area ratio between the fifth solar cells 251 and 252 and the sixth solar cells 261 and 262 may be selected, based on the density of the quantum dots 211, 212, 213, 214, 215, and 216 in the LSC 210. Further, the positions of the fifth solar cells 251 and 252 may be selected as positions to which light beams discharged again from the quantum dots usually travel, but are not limited thereto. Meanwhile, though not shown in the figures, an embodiment in which different types of solar cells are disposed under the LSC 210 and different types of solar cells are also disposed on sides of the LSC 210 is also possible.

Figure 3:
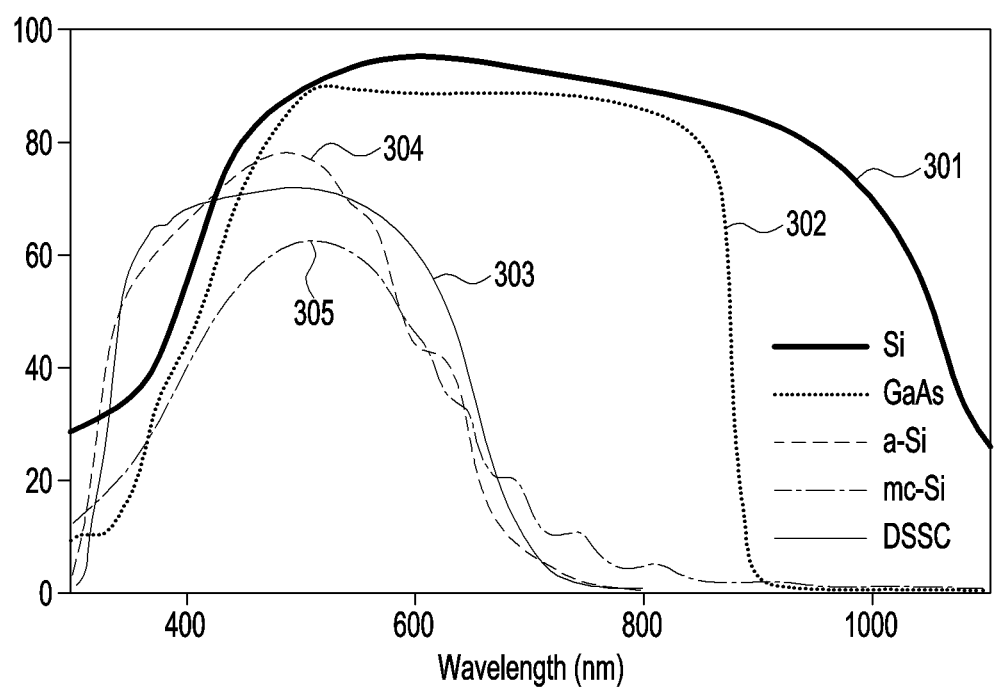
FIG. 3 is a graph showing photoelectric conversion efficiency at wavelengths of solar cells according to various embodiments.

FIG. 3 is a graph showing photoelectric conversion efficiency at wavelengths of solar cells according to various embodiments. In the graph, the x-axis is a wavelength in nm and the y-axis is photoelectric conversion efficiency in %. A first graph 301 shows photoelectric conversion efficiency at each wavelength of an Si solar cell, a second graph 302 shows photoelectric conversion efficiency at each wavelength of a GaAs solar cell, a third graph 303 shows photoelectric conversion efficiency at each wavelength of a Dye-Sensitized Solar Cell (DSSC), a fourth graph 304 shows photoelectric conversion efficiency at each wavelength of an a-Si solar cell, and a fifth graph 305 shows photoelectric conversion efficiency at each wavelength of a mc-Si solar cell. As can be seen from FIG. 3, various types of solar cells may have different wavelength bands over a threshold value (e.g., 60%). As described above, the wavelengths of the light beams transmitting through the electronic device 101 regardless of quantum dots and the wavelengths of the light beams discharged again from quantum dots may be different. In particular, the wavelengths of the light beams discharged again from quantum dots may be different in accordance with at least one of the size or a property of the quantum dots. Accordingly, different types of solar cells can be arranged in various shapes, as shown in FIGS. 2A to 2C.

Figure 4:
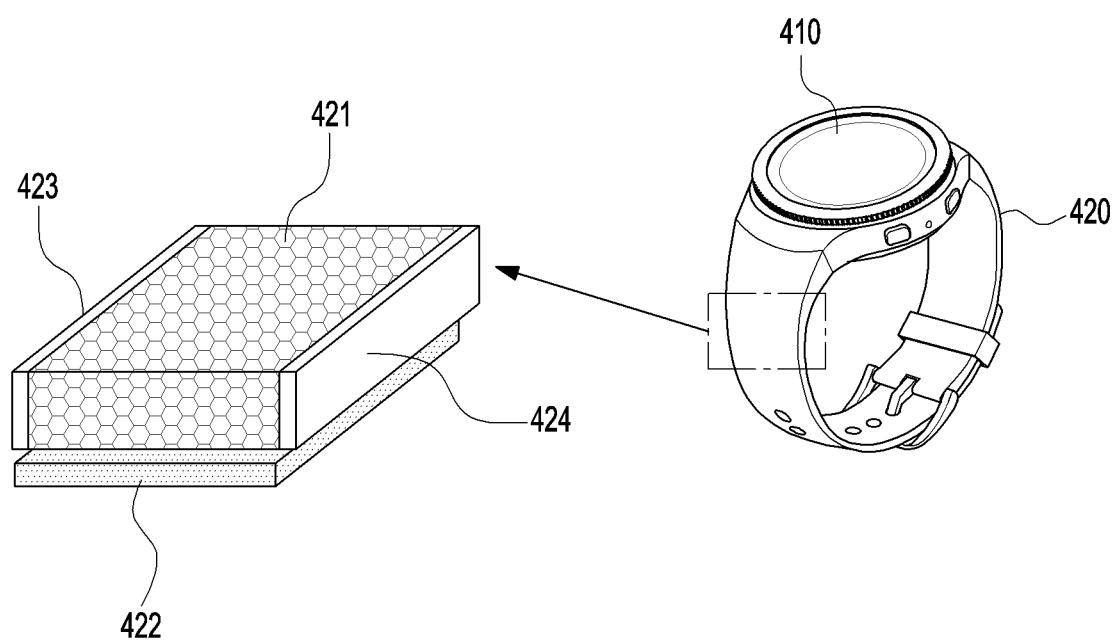
FIG. 4 is a view of an electronic device according to various embodiments.

FIG. 4 is a view of an electronic device according to various embodiments.

As shown in FIG. 4, an electronic device may include a head 410 and a strap 420 of a watch-shaped electronic device. The strap 420 may include a polymer 421, a first solar cell 422, and second solar cells 423 and 424. The polymer 221 may be made of a material that can transmit external light to the second solar cells 423 and 424. The polymer 421 may be disposed to occupy a relatively large area of the strap, whereby a light condensing area can be increased. The first solar cell 422 may be disposed under the polymer 421 and can convert incident light into electrical energy. Quantum dots may be included in the polymer 421 and photoelectric conversion efficiency may be increased by the quantum dots, which will be described in detail below. The polymer 421, for example, include polyvinylidene fluorides (PVDF) or derivatives thereof, may include a ferroelectric having polarization by itself even without an external electrical field, and may be referred to as an LSC, as described above.

Figure 5:
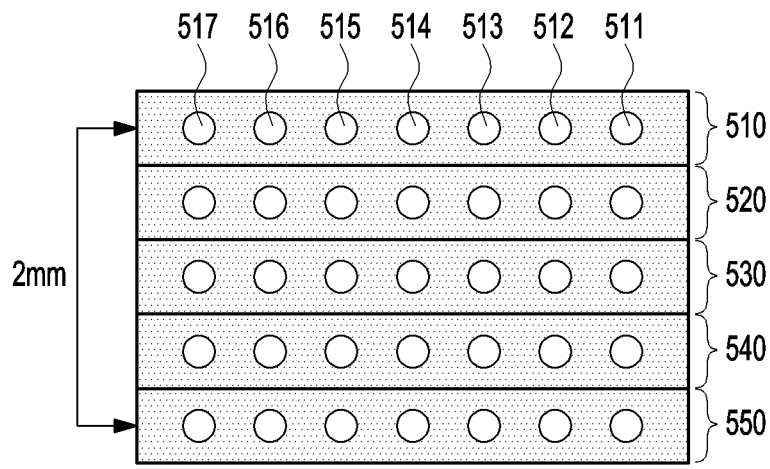
FIG. 5 shows a polymer having a stacked structure according to various embodiments.

FIG. 5 shows a polymer having a stacked structure according to various embodiments. As shown in FIG. 5, one film 510 may include quantum dots 511 to 517 having a relatively good distribution degree. Further, a plurality of films 510 to 550 having quantum dots may be stacked.

Figure 6:
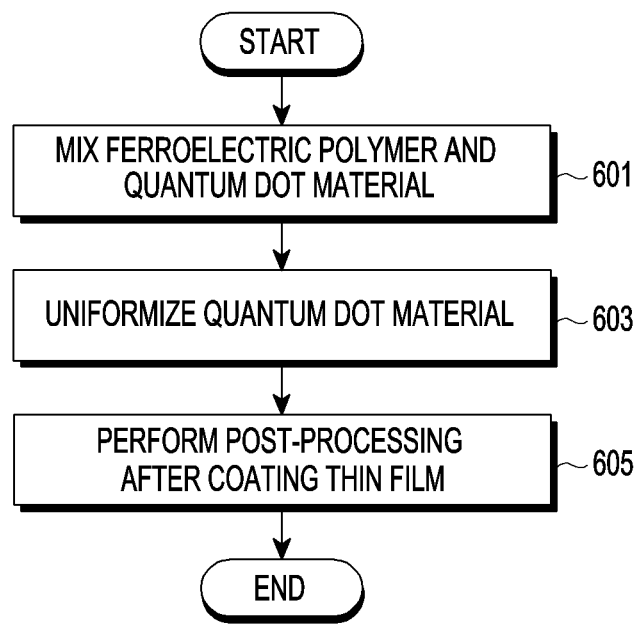
FIG. 6 is a flowchart showing a process of manufacturing a polymer including quantum dots according to various embodiments.

FIG. 6 is a flowchart showing a process of manufacturing a polymer including quantum dots according to various embodiments.

In operation 601, a ferroelectric polymer and a quantum dot material may be mixed. For example, a ferroelectric polymer and a quantum dot material can be mixed by mixing a solution, which is obtained by dissolving a P (VDF-TrFB) ferroelectric polymer into a DMF solvent, with a solution obtained by dissolving CdSe for forming quantum dots into a Toluene solvent. The mixed solution may be coated on a plate and may undergo evaporation and/or heat treatment. Further, it is possible to perform poling while changing an applied voltage, for example, from 100V to 500V. After coating, in operation 602, uniformization of the quantum material may be performed. For example, improving a distribution degree may be performed by adjusting the components of a solvent and chemical potential such that wettability and a uniformity degree can be improved. For example, molecular bonding energy may be adjusted by inputting an additional solvent (MEK) or using sonication, and the distribution degree of the quantum dots may be improved. After the distribution degree is improved, in operation 650, thin film coating and post-processing may be performed. For example, coating based on a polarity control solution may be performed and then post-processing such as heat treatment may be performed. The physical properties of the film may be determined in accordance with the coating condition. The thickness of the formed film, for example, may be 10 to 100 μm, but is not limited thereto. According to various embodiments, a polymer having a structure in which a plurality of films is stacked may be manufactured. For example, the thicker the film, the larger the differences of quantum dots may be, whereby the distribution degree of the quantum dots in the film may be maintained at a good level and a polymer having a structure in which a plurality of films is stacked may be manufactured. The polymer having the stacked structure may have a relatively low poling voltage (e.g., 60V/μm), so which may be advantageous in poling.

Figure 7A:
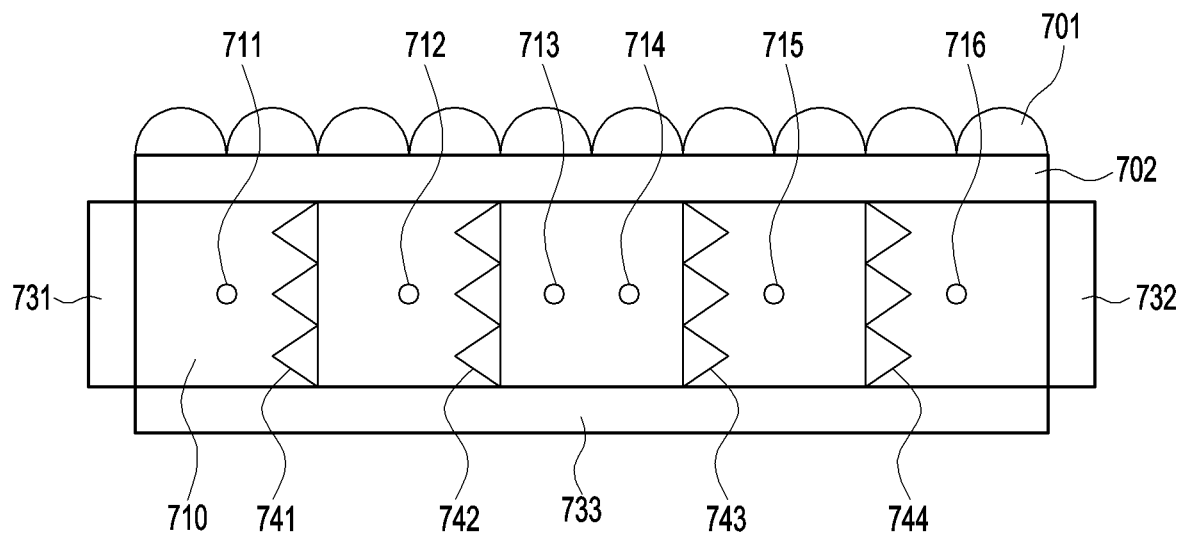
FIG. 7A is a view showing a cross-section of an electronic device according to various embodiments.
Figure 7B:
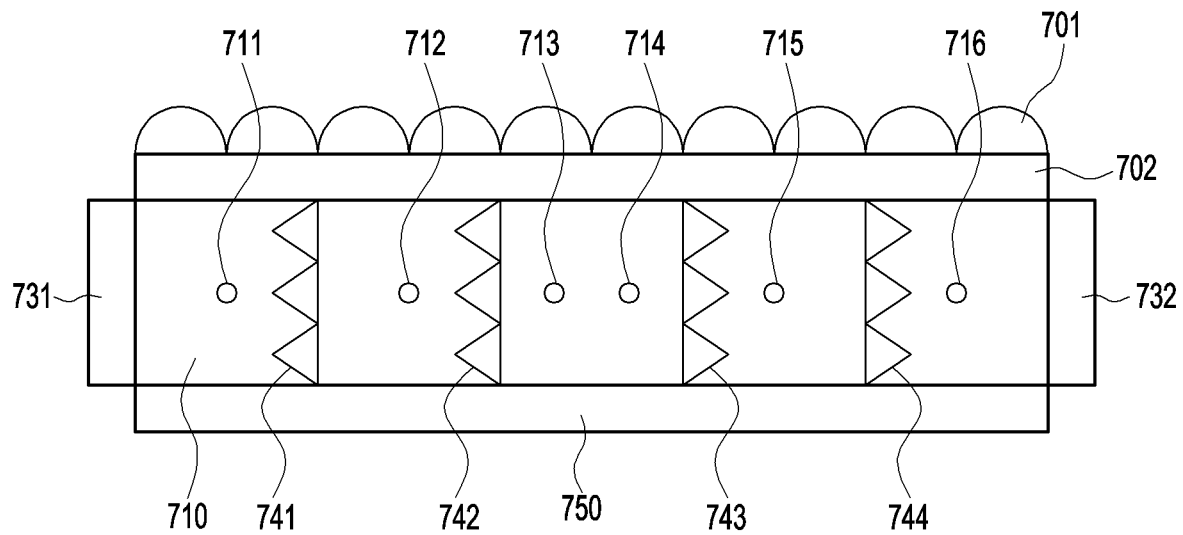
FIG. 7B is a view showing a cross-section of an electronic device according to various embodiments.

FIG. 7A is a view showing a cross-section of an electronic device according to various embodiments. FIG. 7B is a view showing a cross-section of an electronic device according to various embodiments.

As shown in FIG. 7A, an electronic device 101 may include an LSC 710 including at least one quantum dot 711, 712, 713, 714, 715, and 716. A band pass layer 702 may be disposed over the LSC 710. The band pass layer 702 may transmit light beams in a specific wavelength bands and reflect light beams in other wavelength bands. For example, a specific wavelength band of the band pass layer 702 may be determined in a band in which light beams discharged again from the quantum dots 711, 712, 713, 714, 715, and 716 are not included. Accordingly, the light beams discharged again from the quantum dots 711, 712, 713, 714, 715, and 716 are reflected by the band pass layer 702, whereby they can travel in the LSC 710.

An irregular reflection layer 701 may be disposed over the band pass layer 702. The irregular reflection layer 701 can make light, which is incident to the irregular reflection surface of the irregular reflection layer 701, enter the LSC 710. Although the irregular reflection surface of the irregular reflection layer 701 is a convex surface in FIG. 7A, the shape is not limited.

A first solar cell 733 may be disposed under the LSC 710. Second solar cells 731 and 732 may be disposed on sides of the LSC 710. As described above, the first solar cell 733 can convert a light beam passing through the LSC 710 regardless of the quantum dots 711, 712, 713, 714, 715, and 716 into electrical energy with relatively high photoelectric conversion efficiency. The second solar cells 731 and 732 can convert the light beams discharged again from the quantum dots 711, 712, 713, 714, 715, and 716 into electrical energy with relatively high photoelectric conversion efficiency.

Figure 8A:
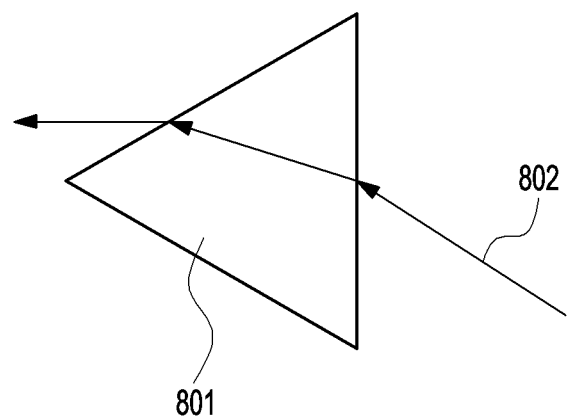
FIG. 8A shows a prism included in an LSC.
Figure 8B:
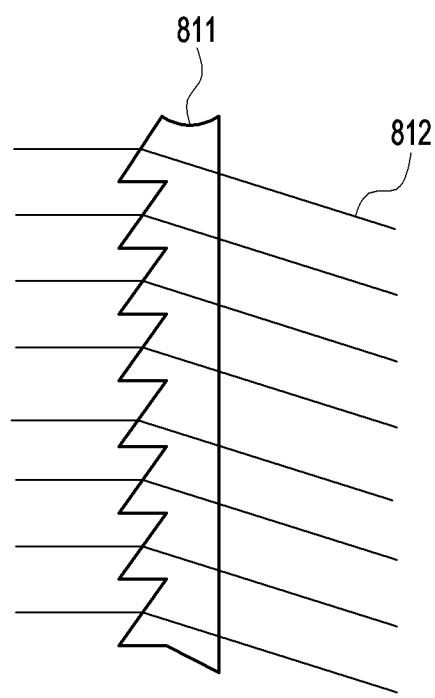
FIG. 8B shows a prism included in an LSC.
Figure 8C:
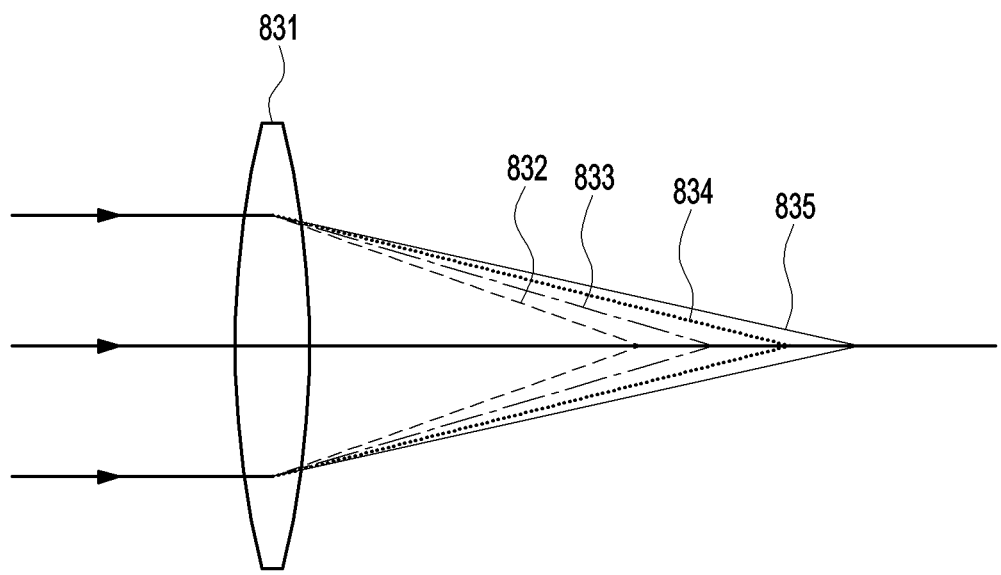
FIG. 8C shows a lens included in an LSC.

At least one prism layer 741, 742, 743, and 744 may be disposed in the LSC 710. The prism layers 741, 742, 743, and 744 can change the paths of the light beams, which are discharged again from the quantum dots 711, 712, 713, 714, 715, and 716, to sides of the LSC 710. For example, the prism layers 741 and 742 disposed at a relatively left side in the LSC 710 may be disposed such that light travels toward the second solar cell 731, and the prism layers 743 and 744 disposed at a relatively right side in the LSC 710 may be disposed such that light travels toward the second solar cell 732. For example, as shown in FIG. 8A, one prism 801 included in a prism layer can change the path of a light beam 802 in a direction substantially parallel with the top surface or the bottom surface of the LSC 710, and accordingly, the amount of light that is incident to the second solar cell 731 can be increased. As shown in FIG. 8B, the light beams 821 can travel in a direction substantially parallel with the top surface or the bottom surface of the LSC 710 by the prism layer 811. The prism layer 811 may be made of polycarbonate (PC), polyester (PET), etc. In various embodiments, a lens 831 shown in FIG. 8C may be included in the LSC 710 of the electronic device 101. The paths of light beams 832, 833, 834, and 835 that are incident to the lens 831 may be different in accordance with the wavelengths. The light beams 832, 833, 834, and 835 passing through the lens 831 are condensed, so the amount of light traveling to side surfaces of the LSC 710 can be increased. The focal length of the lens 831 may be set, for example, in accordance with the distance between the lens 831 to the second solar cell disposed on a side of the LSC 710.

FIG. 7B is a view showing a cross-section of an electronic device according to various embodiments. The electronic device shown in FIG. 7B, as compared with FIG. 7A, may include a reflection layer 750 instead of the first solar cell 733. The reflection layer 750 can reflect and transmit the light beams passing through the LSC 710 or the light beams discharged again from the quantum dots 711, 712, 713, 714, 715, and 716 to the second solar cells 731 and 732.

Meanwhile, the electronic devices 101 according to an embodiment shown in FIGS. 7A and 7B may not include at least one of the components shown in the figures.

Figure 9:
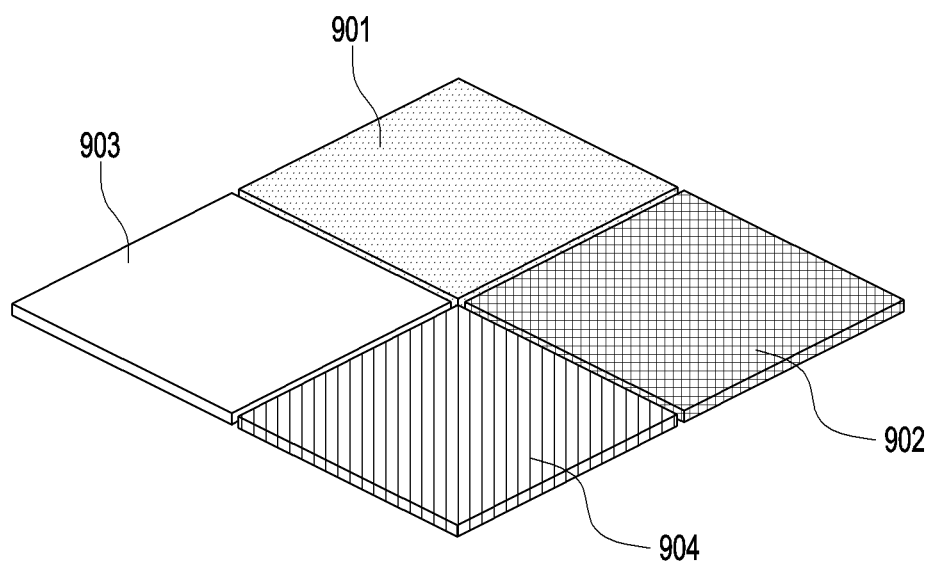
FIG. 9 shows a solar cell modular according to various embodiments.

FIG. 9 shows a solar cell modular according to various embodiments. As shown in FIG. 9, a solar cell modular may be formed by combining a plurality of harvester units 901, 902, 903, and 904. The harvester units 901, 902, 903, and 904 each may include an LSC, a first solar cell may be disposed under the LSC, and a second solar cell may be disposed on a side of the LSC. The harvester units 901, 902, 903, and 904 may be fastened to each other by magnets or may be mechanically or electrically combined.

Figure 10A:
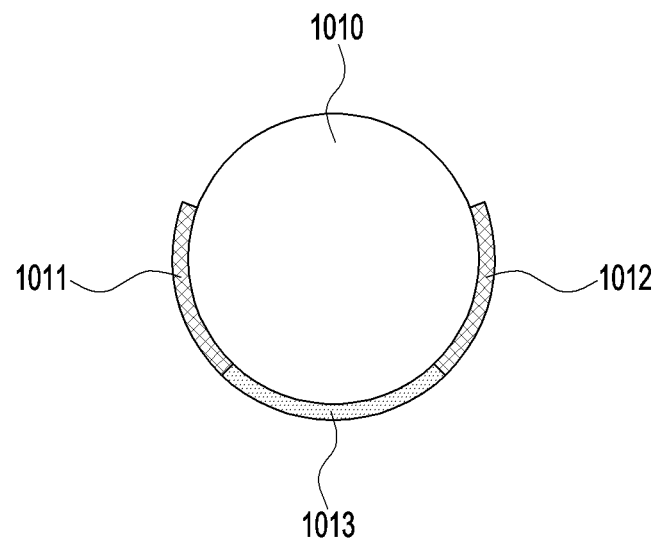
FIG. 10A shows a cross-section for describing arrangement of an LSC and solar cells according to various embodiments.
Figure 10B:
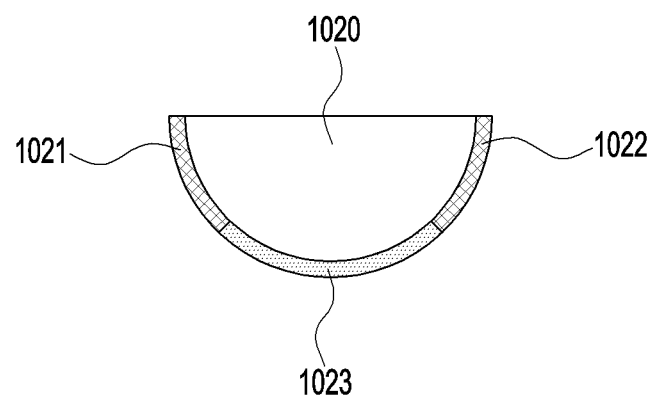
FIG. 10B shows a cross-section for describing arrangement of an LSC and solar cells according to various embodiments.
Figure 10C:
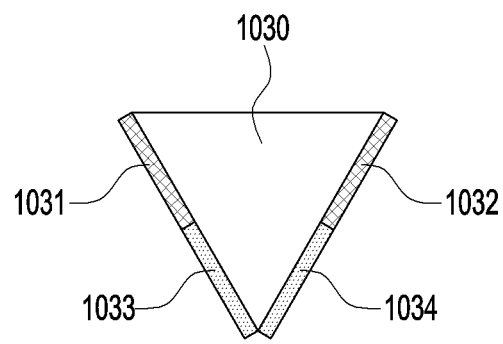
FIG. 10C shows a cross-section for describing arrangement of an LSC and solar cells according to various embodiments.
Figure 10D:
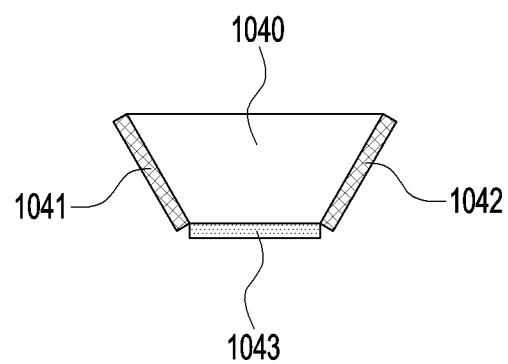
FIG. 10D shows a cross-section for describing arrangement of an LSC and solar cells according to various embodiments.

FIG. 10A shows a cross-section for describing arrangement of an LSC and solar cells according to various embodiments. FIG. 10B shows a cross-section for describing arrangement of an LSC and solar cells according to various embodiments. FIG. 10C shows a cross-section for describing arrangement of an LSC and solar cells according to various embodiments. FIG. 10D shows a cross-section for describing arrangement of an LSC and solar cells according to various embodiments.

Referring to FIG. 10A, an electronic device according to various embodiments may include an LSC 1010 having a circular side surface. A plurality of quantum dots may be included in the LSC 1010. A first solar cell 1013 may be disposed on a first surface of the LSC 1010, and second solar cells 1011 and 1012 may be disposed respectively on a second surface and a third surface of the LSC 1010. As described above, light that is incident to the LSC 1010 may be passed or may be absorbed by the quantum dots disposed in the LSC 1010 and then discharged again. The first solar cell 1013 can receive and convert light passing through the LSC 1010 into electrical energy. The first solar cell 1013 may be a solar cell having relatively high photoelectric conversion efficiency at the wavelength of incident light, that is, light passing through LSC 1010. The second solar cells 1011 and 1012 can convert the light discharged again from the quantum dots into electrical energy. The second solar cells 1011 and 1012 may be solar cells having relatively high efficiency at the wavelength of the light discharged again from the quantum dots.

Referring to FIG. 10B, an electronic device according to various embodiments may include an LSC 1020 having a curved side surface and a flat top surface. A first solar cell 1023 may be disposed on a first surface of the LSC 1020, and second solar cells 1021 and 1022 may be disposed respectively on a second surface and a third surface of the LSC 1020. The first solar cell 1023 can receive and convert light passing through the LSC 1020 into electrical energy. The first solar cell 1023 may be a solar cell having relatively high photoelectric conversion efficiency at the wavelength of incident light, that is, light passing through LSC 1020. The second solar cells 1021 and 1022 can convert the light discharged again from the quantum dots into electrical energy. The second solar cells 1021 and 1022 may be solar cells having relatively high efficiency at the wavelength of the light discharged again from the quantum dots.

Referring to FIG. 10C, an electronic device according to various embodiments may include an LSC 1030 having a triangular side surface. First solar cells 1033 and 1034 may be disposed respectively on a first surface and a second surface of the LSC 1030, and second solar cells 1031 and 1032 may be disposed respectively on a third surface and a fourth surface of the LSC 1030. The first solar cell 1033 and 1034 can receive and convert light passing through the LSC 1030 into electrical energy. The first solar cell 1033 and 1034 may be solar cells having relatively high photoelectric conversion efficiency at the wavelength of incident light, that is, light passing through LSC 1030. The second solar cells 1031 and 1032 can convert the light discharged again from the quantum dots into electrical energy. The second solar cells 1031 and 1032 may be solar cells having relatively high efficiency at the wavelength of the light discharged again from the quantum dots.

Referring to FIG. 10D, an electronic device according to various embodiments may include an LSC 1040 having a pentagonal side surface. A first solar cell 1043 may be disposed on a first surface of the LSC 1040, and second solar cells 1041 and 1042 may be disposed respectively on a second surface and a third surface of the LSC 1040. The first solar cell 1043 can receive and convert light passing through the LSC 1040 into electrical energy. The first solar cell 1043 may be a solar cell having relatively high photoelectric conversion efficiency at the wavelength of incident light, that is, light passing through LSC 1040. The second solar cells 1041 and 1042 can convert the light discharged again from the quantum dots into electrical energy. The second solar cells 1041 and 1042 may be solar cells having relatively high efficiency at the wavelength of the light discharged again from the quantum dots.

Various embodiments as set forth herein may be implemented as software (e.g., program) including instructions that are stored in a storage medium (e.g., internal memory or external memory) that is readable by a machine (e.g., computer). The machine is a device that may invoke the stored instructions from the storage medium and operates according to the invoked instructions, and may include an electronic device (e.g., the electronic device 101) according to the disclosed embodiments. When executed by a processor (e.g., the processor 120), the instructions may cause the processor to perform functions corresponding to the instructions, with or without using other elements under the control of the processor. The instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

What is claimed is:

1. An electronic device comprising:
   a polymer including a plurality of quantum dots, wherein the polymer is ferroelectric;
   a first solar cell disposed under the polymer;
   a second solar cell disposed on a first side of the polymer;
   a third solar cell disposed on a second side of the polymer;
   a first prism or a first lens disposed in the polymer;
   a second prism or a second lens disposed in the polymer; and
   a battery configured to be charged with electrical energy from at least one of the first solar cell, the second solar cell, or the third solar cell,
   wherein the first solar cell has first photoelectric conversion efficiency in a first wavelength band, the first photoelectric conversion efficiency being equal to or higher than a specified threshold value,
   wherein the second solar cell has second photoelectric conversion efficiency in a second wavelength band different from the first wavelength band, the second photoelectric conversion efficiency being equal to or higher than the specified threshold value,
   wherein a wavelength of a first portion of first light passing through the polymer is included in the first wavelength band,
   wherein a wavelength of a first portion of second light absorbed and then discharged by at least some of the plurality of quantum dots is included in the second wavelength band,
   wherein the first prism or the first lens is configured to change a first traveling direction of the second light absorbed and then discharged by the at least some of the plurality of quantum dots to the second solar cell and the first traveling direction is parallel with a top surface or a bottom surface of the polymer, and
   wherein the second prism or the second lens is configured to change a second traveling direction of the second light absorbed and then discharged by the at least some of the plurality of quantum dots to the third solar cell and the second traveling direction is parallel with the top surface or the bottom surface of the polymer.

2. The electronic device of claim 1, further comprising a regulator configured to change a voltage of the electrical energy from the at least one of the first solar cell or the second solar cell and output the electrical energy to the battery.

3. The electronic device of claim 2, further comprising a capacitor configured to store the electrical energy from the at least one of the first solar cell or the second solar cell, and transmit the stored electrical energy to the regulator.

4. The electronic device of claim 3, further comprising a switch configured to selectively connect the capacitor and the regulator,
   wherein the switch is controlled to be turned on when a voltage applied to the capacitor is equal to or higher than a predetermined threshold voltage, and is controlled to be turned off when the voltage applied to the capacitor is lower than the predetermined threshold voltage.

5. The electronic device of claim 1, wherein the polymer has a structure in which a plurality of films including at least one quantum dot are stacked.

6. The electronic device of claim 1, further comprising a fourth solar cell disposed under the polymer,
   wherein the fourth solar cell has third photoelectric conversion efficiency in a fourth wavelength band equal to or higher than the specified threshold value, and
   wherein a wavelength of a second portion of the second light absorbed and then discharged by the at least some of the plurality of quantum dots is included in the fourth wavelength band.

7. The electronic device of claim 1,
   wherein the third solar cell has third photoelectric conversion efficiency in a third wavelength band equal to or higher than the specified threshold value, and
   wherein a wavelength of a second portion of the first light passing through the polymer is included in the third wavelength band.

8. The electronic device of claim 1, further comprising a band pass layer disposed over the polymer,
   wherein the band pass layer is configured to reflect the second light absorbed and then discharged by the at least some of the plurality of quantum dots, and pass light having a wavelength different from a wavelength of the second light absorbed and then discharged by the at least some of the plurality of quantum dots.

9. The electronic device of claim 1, further comprising an irregular reflection layer disposed over the polymer,
   wherein light that is incident to an irregular reflection surface of the irregular reflection layer travels into the polymer.

* * * * *